(12) United States Patent
Okitsu

(10) Patent No.: US 7,004,762 B2
(45) Date of Patent: Feb. 28, 2006

(54) SOCKET FOR ELECTRICAL PARTS

(75) Inventor: Akira Okitsu, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/720,276

(22) Filed: Nov. 25, 2003

(65) Prior Publication Data

US 2004/0106307 A1    Jun. 3, 2004

(30) Foreign Application Priority Data

Nov. 27, 2002    (JP)    .............................. 2002-343215

(51) Int. Cl.
*H01R 9/09* (2006.01)
(52) U.S. Cl. ...................................................... 439/73
(58) Field of Classification Search .................. 439/66, 439/71, 70, 72, 73, 331, 67, 91, 74, 68; 361/403, 361/763; 174/254, 262
See application file for complete search history.

(56) References Cited

U.S. PATENT DOCUMENTS 5,101,553 A * 4/1992 Carey et al. .................... 29/882
5,810,607 A * 9/1998 Shih et al. ...................... 439/66
5,816,828 A * 10/1998 Ikeya et al. ..................... 439/73
6,217,343 B1 * 4/2001 Okuno ............................ 439/67
6,524,115 B1 * 2/2003 Gates et al. .................... 439/66
6,574,114 B1 * 6/2003 Brindle et al. ................ 361/769

FOREIGN PATENT DOCUMENTS

JP    H9-161870    6/1997

* cited by examiner

*Primary Examiner*—Alexander Gilman
(74) *Attorney, Agent, or Firm*—Staas & Halsey LLP

(57) ABSTRACT

A socket for an electrical part which is mounted to a circuit board includes a contact sheet disposed on the circuit board, and a land sheet disposed between the contact sheet and the electrical part. The contact sheet includes an elastic body in form of plate having elasticity and insulating property and a conductive portion embedded in the elastic body and the conductive portion has end portions exposed to both surfaces of the elastic body so as to be electrically connected to the land sheet. The land sheet is composed of an insulating sheet having both surfaces on which electrode portions are formed respectively to be electrically conductive to each other. One of the electrode portions is formed on one side of the surfaces of the land sheet to be contacted and electrically connected to a terminal of the electrical part, and the other one thereof is formed on the other one side of the surfaces of the land sheet to be contacted and electrically connected to the conductive portion of the contact sheet.

12 Claims, 5 Drawing Sheets

SOCKET FOR ELECTRICAL PARTS

BACKGROUND OF THE INVENTION

1. Field of the Invention

The present invention relates to a socket for an electrical part adapted to carry out an inspection or test of an electrical part such as semiconductor device (called as "IC package" hereinlater).

2. Related Art of the Invention

In a recent art of this field, it has been required for an IC package to be operated at an improved high speed, which involves difficulty of exactly measuring the electrical performance of the electrical part by using a conventionally existing socket therefore.

Under such circumstances, there is proposed a socket capable of responding to high frequency as disclosed, for example, in Japanese Patent Laid-open Publication No. JP H9-161870-A, which is shown in FIG. 8.

With reference to FIG. 8, there is such disclosure as "elastomer connector 1 exists between an IC package 2 and a printed circuit board 3 for inspection, a solder ball 5 of the IC package 2 and a terminal 6 of the printed circuit board 3 are electrically connected to each other through a fine metal wire 4 provided for the elastomer connector 1".

However, with such socket as mentioned above, in the repeated use, solder component of the solder ball 5 of the IC package 2 adheres to the fine metal wire 4 of the elastomer connector 1, and hence, electrical performance is degraded and deteriorated, resulting in shortage of usable life time, and in a case when it is desired to re-use such degraded socket, it is necessary to entirely exchange the expensive elastomer connector with new one, being disadvantageous.

Furthermore, there is also provided a socket responding to high frequency use utilizing a probe-pin. In such socket, however, in order to ensure a suitable contacting pressure, it is required to flexibly combine a plurality of metal members or parts or to incorporate a spring or like, which will lead to a complicated or large structure of the entire socket. Moreover, in order to make short the dimensions of such socket, there exists critical limit or like, thus being difficult to suitably apply to the high frequency use.

SUMMARY OF THE INVENTION

The present invention was conceived in consideration of the above circumstances in the conventional art and an object of the present invention is to provide a socket for electrical parts capable of responding to high frequency and being easily reusable.

The above and other objects can be achieved according to the present invention by providing a socket for an electrical part which is mounted on a circuit board and in which an electrical part is mounted so as to be electrically connected to the circuit board, the socket comprising:

a contact sheet disposed on the circuit board; and a land sheet disposed between the contact sheet and the electrical part, wherein the contact sheet includes an elastic body in the form of plate having elasticity and insulating property and a conductive portion embedded in the elastic body, the conductive portion has end portions exposed to both surfaces of the elastic body so as to be electrically connected to the land sheet, the land sheet is composed of an insulating sheet having both surfaces on which electrode portions are formed respectively to be electrically conductive to each other, one of the electrode portions is formed on one side of the surfaces of the land sheet to be contacted and electrically connected to a terminal of the electrical part and the other one of the electrode portions is formed on the other one side of the surfaces of the land sheet to be contacted and electrically connected to the conductive portion of the contact sheet so as to electrically connect the electrical part to the circuit board.

In a preferred embodiment of the above aspect, the elastic body of the contact sheet may be formed of a rubber material.

The conductive portion comprises a number of metal wires which are arranged so that a plurality of these metal wires contact one of the electrode portions of the land sheet.

The land sheet may be formed of a flexible printed circuit board comprising a flexible film having both surfaces on which electrodes are printed respectively to be electrically conductive to each other.

The socket for an electrical part may further comprise upper and lower plates between which end portions of the contact sheet and land sheet are clamped and held.

The socket for an electrical part may further comprise a plate member and end portions of the contact sheet and land sheet are clamped and held between the plate member and the circuit board.

In a more specific aspect, there is provided a socket for an electrical part which is mounted to a circuit board and in which an electrical part is mounted so as to be electrically connected to the circuit board, the socket comprising:

a contact sheet disposed on the circuit board and including an elastic body in form of plate having elasticity and insulating property and a conductive portion embedded in the elastic body, the conductive portion having both ends exposed to both surfaces of the elastic body;

a land sheet disposed between the contact sheet and the electrical part, the land sheet being composed of an insulating sheet having both surfaces on which electrode portions are formed respectively to be electrically conductive to each other, one of the electrode portions being formed on one side of the surfaces of the land sheet to be contacted and electrically connected to a terminal of the electrical part and the other one of the electrode portions being formed on the other one side of the surfaces of the land sheet to be contacted and electrically connected to the conductive portion of the contact sheet so as to establish an electrical connection between the electrical part to the circuit board; and at least one plate member mounted to the circuit board, the contact sheet and land sheet have end portions which are clamped and held between the plate member and the circuit board. The plate member may include upper and lower plates between which end portions of the contact sheet and land sheet are clamped and held.

According to the structures and characters of the present invention mentioned above, the suitable contacting pressure can be ensured by the location of the elastic insulating body of the contact sheet, and the conductive portions embedded in the insulating body are hence allowed to only have conductive property. Accordingly, the total length of the conductive portion can be made shorter and the thickness of the land sheet can also be made thinner, so that the current passing path can be shortened, thus providing an IC socket of low inductance, which can measure the IC package responding to high frequency up to several GHz and, hence, ensuring the high frequency measurement performance of the IC package.

In addition, the land sheet is disposed to the contacting portion to the terminal of the IC package, and the solder of the lead adheres to the land sheet without adhering to the contact sheet. Accordingly, in the case of re-use of the IC socket, it is not necessary to exchange an expensive contact sheet and it is only necessary to exchange a relatively cheap land sheet, thus lowering running cost, being advantageous.

Furthermore, a modified embodiment of the present invention may be applicable to IC sockets of BGA (Ball Grid Array) type and LGA (Land Grid Array) type, without exchanging the contact sheet, only by changing the design of the land sheet.

Still furthermore, since the conductive member of the contact sheet is composed of the fine metal wires, a plurality of wires contact one electrode of the predetermined electrode of the land sheet, so that the conductive performance can be further ensured.

Still furthermore, since the land sheet is composed of a flexible printed circuit board, it can provide a thin thickness and can be cheaply manufactured.

Moreover, the IC socket may be extremely easily assembled only by holding the contact sheet and the land sheet between the upper and lower plates.

Still furthermore, the socket for an electrical part can be easily mounted on the circuit board only by arranging the contact sheet and the land sheet on the circuit board and the one, i.e., upper, plate member is mounted thereto, and the disassembling or dismounting process can be also easily done for exchanging the land sheet, thus being convenient and advantageous in cost as well as labor.

The nature and further characteristic features may be made more clear from the following descriptions made with reference to the accompanying drawings.

DESCRIPTION OF THE PREFERRED EMBODIMENTS

[First Embodiment]

Figure 1:
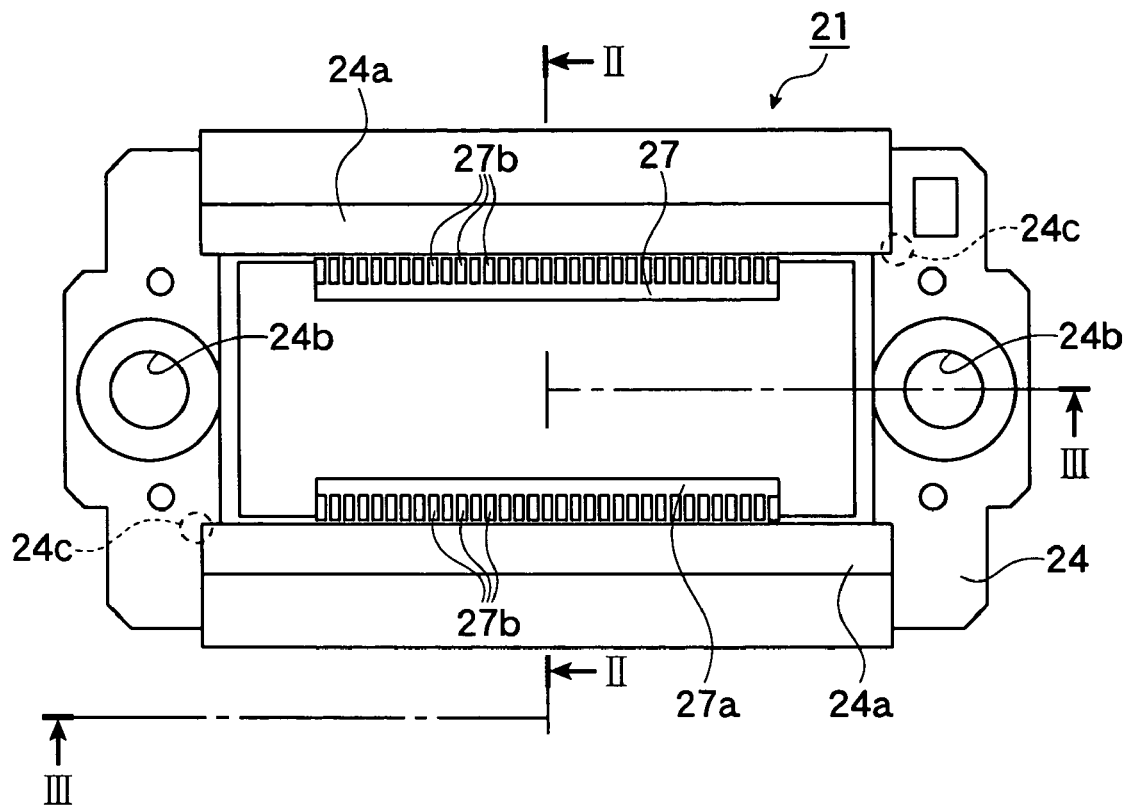
FIG. 1 is an illustrated plan view of an IC socket according to a first embodiment of the present invention.

FIGS. 1 to 6 represent a first embodiment of the present invention.

With reference to FIGS. 1 to 6, reference numeral 21 denotes an IC socket as "socket for an electrical part", which is to be mounted on a (printed) circuit board 23, and an IC package 22 and the circuit board 23 are electrically connected by holding the IC package 22 to the IC socket 21.

Figure 6A:
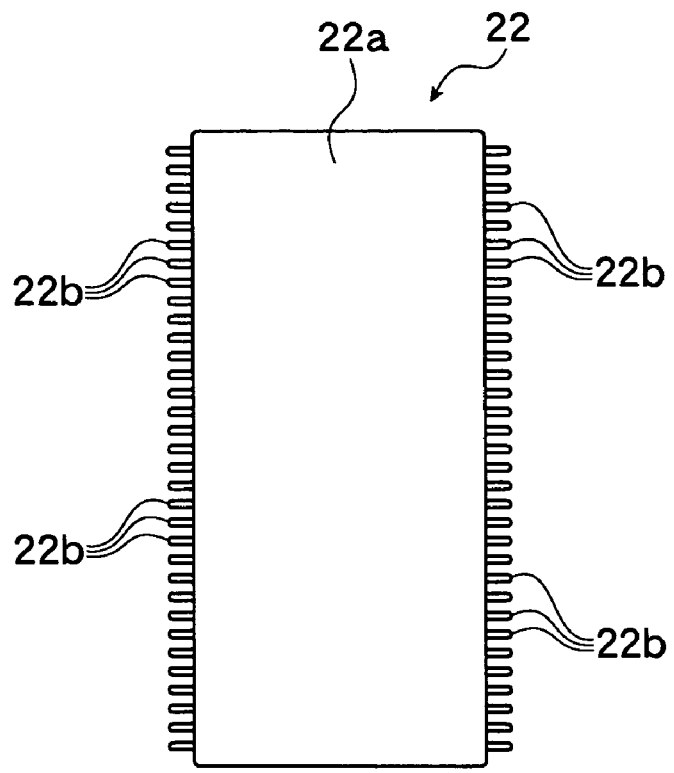
FIG. 6 shows the IC package concerning the first embodiment and includes FIG. 6A showing a plan view of the IC package and FIG. 6B showing an enlarged front view of FIG. 6A.
Figure 6B:
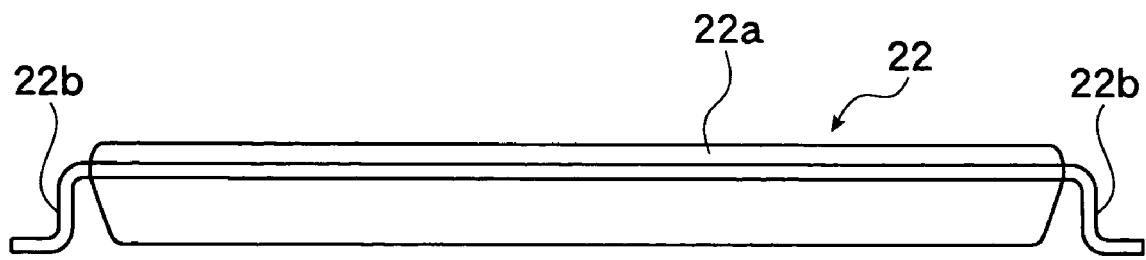

The IC package 22 includes, as shown in FIG. 6, a rectangular package body 22a, which has both longitudinal side edge portions to which a number of leads 22b, each in shape of crank, are arranged at predetermined pitches.

Figure 2:
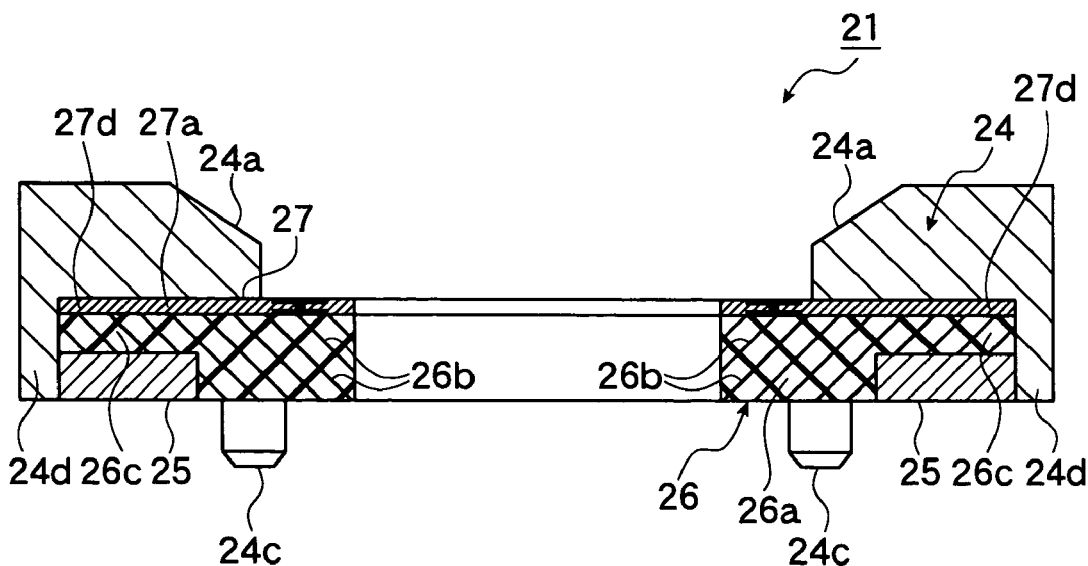
FIG. 2 is a sectional view, in an enlarged scale, taken along the line II—II in FIG. 1.

The IC socket 21 comprises, as shown in FIGS. 1 and 2, an upper plate 24, a lower plate 25, a contact sheet 26 and a land sheet 27.

Further, it is first to be noted that terms "upper", "lower", "right" and "left" and the like terms are used herein with reference to illustrations of the figures of the drawings or in practically usable state of the socket.

The upper plate 24 has a frame structure provided with a pair of guide members 24a at upper lateral portions so as to guide the IC package 22 and also formed with screw mount holes 24b, with which screws, not shown, are to be engaged, at both longitudinal end portions thereof. The upper plate 24 is secured to the circuit board 23 by screwing screws or like into these mount holes 24b and engaging them with nuts.

Figure 3:
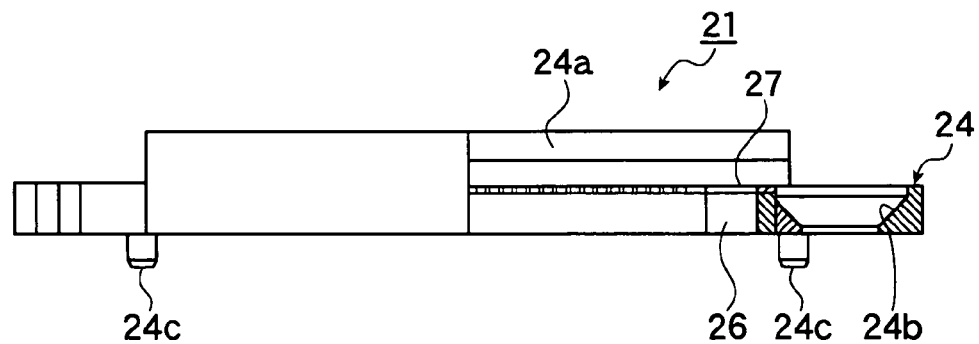
FIG. 3 is a sectional view taken along the line III—III in FIG. 1.

Furthermore, as shown in FIG. 3, positioning pins 24c are arranged to the lower surface of the upper plate 24 so as to be fitted into the circuit board 23 to thereby secure the upper plate 24 to a predetermined position.

On the other hand, the lower plate 25 has a plate-like structure which is fitted into inside portions of the side wall sections 24d of the frame structure of the upper plate 24. End portions 26c of the contact sheet 26 and end portions 27d of the land sheet 27 are interposed, in a clamped and held manner, between the upper and lower plates 24 and 25 as best shown in FIG. 2.

Figure 4:
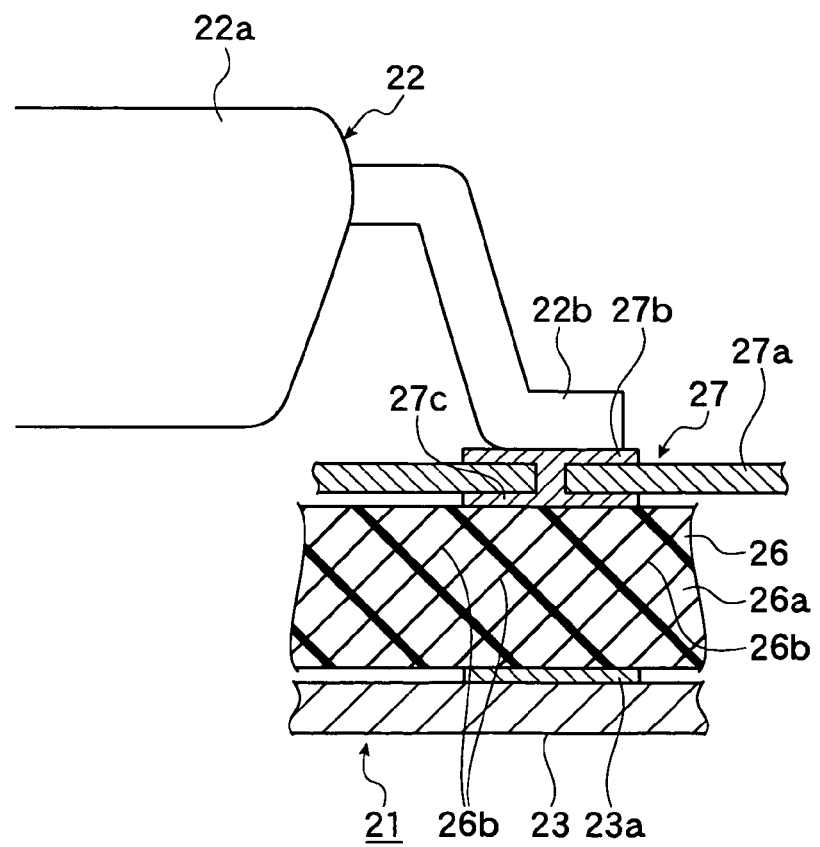
FIG. 4 is an enlarged sectional view showing an essential portion of an IC package in an accommodated state.

The contact sheet 26 is composed of, as shown in FIG. 4, an insulating body 26a formed of silicone rubber having elasticity or flexibility and fine metal wires 26b, as "conductive members", which are plated with gold and embedded, with high density, in the insulating body 26. These fine metal wires 26b are obliquely disposed in the insulating body 26a in parallel with each other having predetermined angle, for example, 45 degrees in this embodiment. The upper and lower ends of these metal wires 26b are exposed to and slightly project from upper and lower surfaces of the insulating body 26a.

The end portions 26c of the contact sheet 26 are formed to be thin so as to be suitably held between the upper and lower plates 24 and 25 as mentioned above. For example, the contact sheet 26 has a thickness of 2 mm and the fine metal wires 26b are embedded at a pitch of 1 mm.

On the other hand, the land sheet 27 has a structure of flexible printed circuit board (FPC) having a thin insulating film 27a having flexibility and insulating property. An upper side electrode (portion) 27b and a lower side electrode (portion) 27c are printed on upper and lower surfaces of this insulating film 27a, these upper and lower side electrodes 27b and 27c being made conductive to each other.

These electrodes 27b and 27c are arranged at positions, at predetermined pitch, corresponding to the leads 22b of the IC package 22 in a manner such that the upper side electrode 27b contacts the lower surface of the lead 22b so as to be electrically conductive and, on the other hand, the lower side electrode 27c contacts the upper end of a predetermined fine metal wire 26b of the contact sheet 26 so as to be electrically conductive. The lower side electrode 27c contacts a number of metal wires 26c, which in turn contact a predetermined electrode portion of the circuit board 23.

The land sheet 27 has a thickness of for example, about 0.05 to 0.1 mm.

The socket of the characters and structures mentioned above will function or operate as follows.

The IC package 22 conveyed by means of automatic machine, for example, is mounted and accommodated in the IC socket 21 which is preliminarily placed on the circuit board 23. In this operation, the IC package 22 is guided to the guide portions 24a of the upper plate 24 and mounted on the predetermined position.

Under the state, each lead 22b of the IC package 22 contacts the predetermined upper side electrode 27b of the land sheet 27 to thereby establish an electrical connection between the lead 22b and the upper side electrode 27b.

Then, a pressing piece on the side of the automatic machine, not shown, presses the lead 22b of the IC package 22 from the upper side to thereby press the lead 22b against the upper side electrode 27b of the land sheet 27. Thus, the contact sheet 26 is elastically deformed, i.e., compressed, and the lower side electrode 27c is contacted, with a predetermined contacting pressure, to the fine metal wire 26b, which is then contacted to the land 23a of the circuit board 23 with a predetermined contacting pressure.

In the manner as mentioned above, the IC package 22 is electrically connected to the circuit board 23 through the IC socket 21 to thereby carry out a performance test of the IC package to judge the quality of products.

In the socket for an electrical part such as mentioned above, the suitable contacting pressure can be ensured by the location of the elastic insulating body 26a of the contact sheet 26, and the conductive metal wires 26b embedded in the insulating body 26a are allowed to only have conductive property. Accordingly, the total length of the fine metal wire 26b can be made shorter and the thickness of the land sheet 27 can be also made thinner, so that the current passing path can be shortened, thus providing an IC socket of low inductance, which can measure the IC package 21 having high frequency up to several GHz and, hence, ensuring the high frequency measurement performance of the IC package.

In addition, the land sheet 27 is disposed to the contacting portion to the lead 22b of the IC package 22, and the solder of the lead 22b adheres to the land sheet 27, so that the solder does not adhere to the contact sheet 26. Accordingly, in the case of re-use of the IC socket 21, it is not necessary to exchange an expensive contact sheet 26 and it is only necessary to exchange a relatively cheap land sheet 27, thus lowering running cost, being advantageous.

Further, although, in this embodiment, there is disclosed the IC socket 21 for the IC package 22 having the leads 22b each extending sideways from the body thereof, in an alternation, the embodiment may be applicable to IC sockets of BGA (Ball Grid Array) type and LGA (Land Grid Array) type, without exchanging the contact sheet 26, only by changing the design of the land sheet 27.

Figure 5:
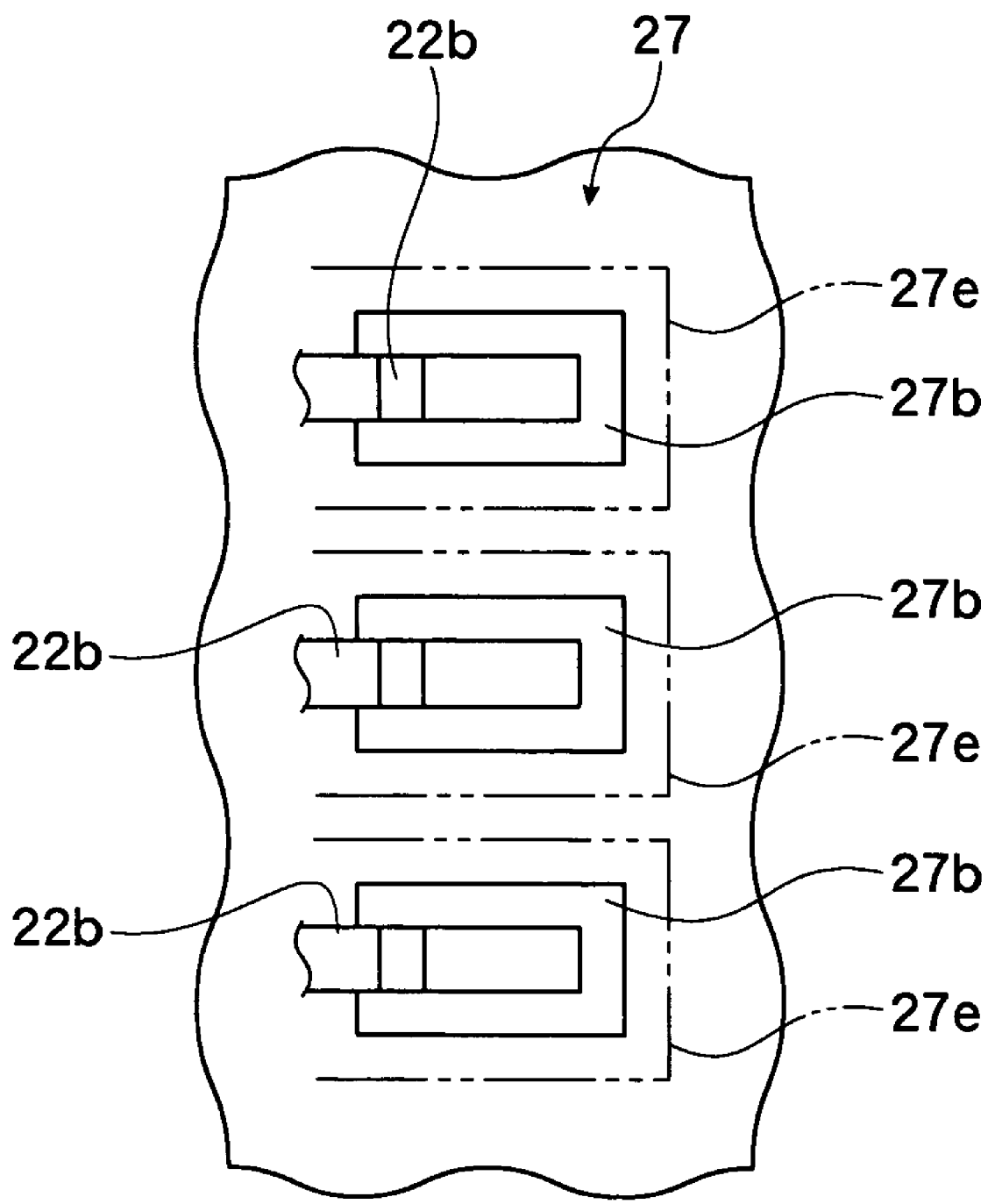
FIG. 5 is an enlarged plan view showing a lead location of the IC package in the accommodated state.

Moreover, as shown with two-dot-chain line in FIG. 5, ⊐-shaped cutouts 27e are formed around the respective electrodes 27b of the land sheet 27. According to this structure, the respective electrodes 27b may be independently displaced, and therefore, even if the positional relationship between the respective leads 22b in the height direction is slightly shifted, a plurality of leads 22b can be contacted to the predetermined one electrode 27b of the land sheet 27 at the desired contacting pressure.

Still furthermore, since the "conductive member" of the contact sheet 26 is composed of the fine metal wires 26b, a plurality of wires 26b contact one electrode 27c of the predetermined electrode 27c of the land sheet 27, so that the conductive performance can be further ensured.

Still furthermore, since the land sheet 27 is composed of a flexible printed circuit board, it can provide a thin thickness and can be cheaply manufactured. Moreover, the IC socket 21 can be extremely easily assembled only by holding the contact sheet 26 and the land sheet 27 between the upper and lower plates 24 and 25.

[Second Embodiment]

Figure 7:
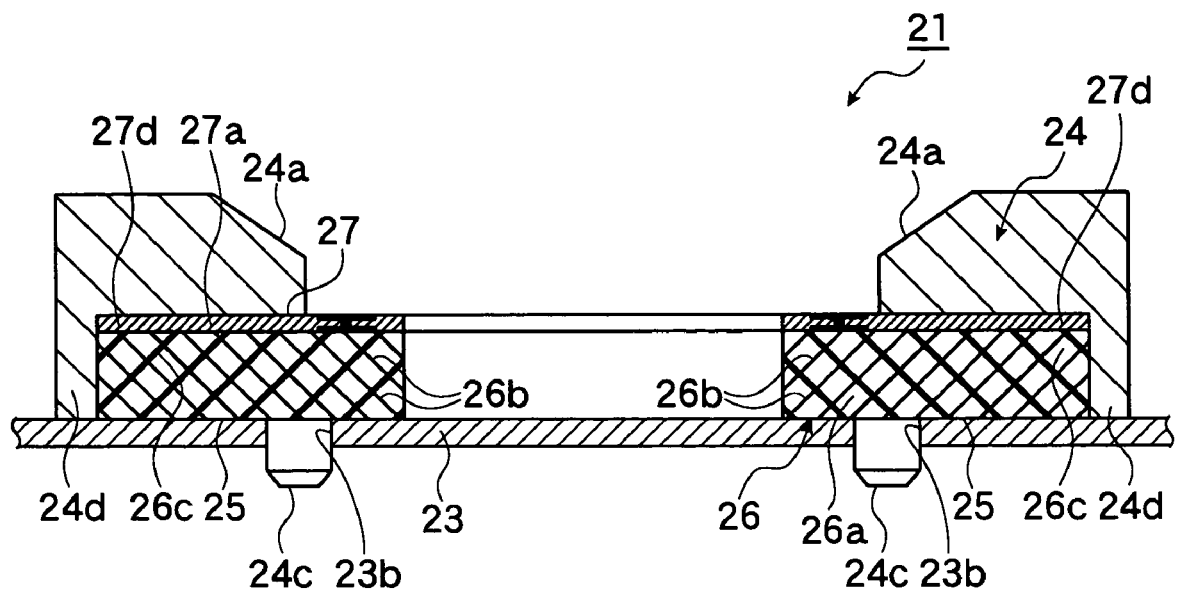
FIG. 7 is a sectional view, corresponding to FIG. 2, representing a second embodiment of the present invention.
Figure 8:
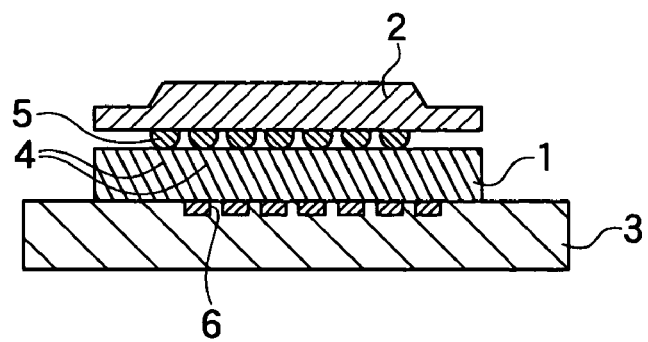
FIG. 8 is a sectional view showing a conventional socket.

FIG. 7 represents the second embodiment of the present invention, which differs from the first embodiment in the manner of clamping the contact sheet 26 and the land sheet 27.

That is, in this second embodiment, the lower plate 25 such as in the first embodiment is eliminated and the contact sheet 26 and the land sheet 27 are clamped between and held by the upper plate 24 and the circuit board 23. The upper plate 24 is provided with a positioning pin 14c projecting downward and then fitted into a mount hole 23b of the circuit board 23 to thereby secure it at a predetermined position.

According to the structure of this second embodiment, the upper plate 24 can be mounted to the circuit board 23 with the contact sheet 26 and the land sheet 27 being disposed on the circuit board 23, thus making simple the assembling of the IC socket. In addition, in the case of exchanging of the land sheet 27, this exchanging can be easily done only by disassembling or dismounting the upper plate 24.

Moreover, the elimination of the lower plate 25 can contribute the reducing of the number of parts or elements, thus being economical.

Further, it is to be noted that the present invention is not limited to the described embodiments and many other changes and modifications may be made without departing from the scopes of the appended claims.

For example, although, in the described embodiments, the present invention is applied to the IC socket 21 as a socket for an electrical part, the present invention is not limited thereto and may be applied to other devices or other type IC socket such as open-top type, clamshell type or like, which is provided with a contact sheet and a land sheet.

Furthermore, there may be utilized an electrode portion of the land sheet of, for example, bead-crown type, other than the flat-plate type.

Still furthermore, although, in the described embodiment, the fine metal wires 26b are embedded in the inclined manner, they may be arranged perpendicularly or arranged so that one metal wire 26b contacts one electrode 27c. Moreover, material or shape other than the described fine metal wire 26b may be utilized as "conductive member" in the described embodiment.

What is claimed is:

1. A socket for an electrical part which is mounted to a circuit board and in which an electrical part is mounted so as to be electrically connected to the circuit board, said socket comprising:

an upper plate for guiding and accommodating the electrical part;

a contact sheet disposed on an upper surface of the circuit board;

a land sheet disposed between the contact sheet and the electrical part; and a lower plate disposed between the circuit board and the contact sheet for clamping end portions of the contact sheet and end portions of the land sheet between the upper and lower plates, said upper plate being provided with a side wall section extending downward for positioning the end portions of the contact sheet and the end portions of the land sheet, said contact sheet including an elastic body in form of a plate having first and second surfaces and having elasticity and an insulating property and a conductive portion embedded in the elastic body, said conductive portion having end portions exposed to both the first and second surfaces of the plate of the elastic body so as to be electrically connected to the land sheet, said land sheet being composed of an insulating sheet having first and second surfaces having first and second electrode portions formed thereon respectively to be electrically conductive to each other, one of said first and second electrode portions being formed on one of the first and second surfaces of the land sheet to be contacted and electrically connected to a terminal of the electrical part and the other of the first and second electrode portions being formed on the other of the first and second surfaces of the land sheet to be contacted and electrically connected to the conductive portion of the contact sheet so as to electrically connect the electrical part to the circuit board.

2. The socket for an electrical part according to claim 1, wherein said conductive portion comprises a number of metal wires which are arranged so that a plurality of said number of metal wires contact one of the first and second electrode portions of the land sheet.

3. The socket for an electrical part according to claim 1, wherein said land sheet is a flexible printed circuit board comprising a flexible film having both surfaces on which electrodes are printed respectively to be electrically conductive to each other.

4. The socket for an electrical part according to claim 1, wherein said elastic body of the contact sheet is formed of a rubber material.

5. The socket for an electrical part according to claim 4, wherein said conductive portion comprises a number of metal wires which are arranged so that a plurality of said number of metal wires contact one of the first and second electrode portions of the land sheet.

6. The socket for an electrical part according to claim 4, wherein said land sheet is a flexible printed circuit board comprising a flexible film having both surfaces on which electrodes are printed respectively to be electrically conductive to each other.

7. A socket for an electrical part which is mounted to a circuit board and in which an electrical part is mounted so as to be electrically connected to the circuit board, said socket comprising:

an upper plate for guiding and accommodating the electrical part;

a contact sheet disposed on the circuit board and including an elastic body in form of a plate having first and second surfaces and having elasticity and an insulating property and a conductive portion embedded in the elastic body, said conductive portion having first and second ends which are exposed to the first and second surfaces of the elastic body, respectively;

a land sheet disposed between the contact sheet and the electrical part with the contact sheet and the land sheet being clamped between the upper plate and the circuit board, said land sheet being composed of an insulating sheet having first and second surfaces on which first and second electrode portions are formed respectively to be electrically conductive to each other, one of said first and second electrode portions being formed on one of the first and second surfaces of the land sheet to be contacted to and electrically connected to a terminal of the electrical part and the other of the first and second electrode portions being formed on the other of the first and second surfaces of the land sheet to be contacted and electrically connected to the conductive portion of the contact sheet, wherein the upper plate is provided with a side wall section extending downward for positioning end portions of the contact sheet and end portions of the land sheet.

8. The socket for an electrical part according to claim 7, further comprising a lower plate, wherein the end portions of said contact sheet and the end portions of said land sheet are clamped between the upper plate and the lower plate.

9. A socket for an electrical part which is mounted to a circuit board and in which an electrical part is mounted so as to be electrically connected to the circuit board, said socket comprising:

an upper plate for guiding and accommodating the electrical part;

a contact sheet disposed on an upper surface of the circuit board; and a land sheet disposed between the contact sheet and the electrical part, wherein the upper plate is provided with a side wall section extending downward for positioning end portions of the contact sheet and end portions of the land sheet, the contact sheet and the land sheet are disposed under the upper plate and are clamped between the upper plate and the circuit board, the contact sheet includes an elastic body in form of a plate having first and second surfaces and having elasticity and an insulating property and a conductive portion embedded in the elastic body, the conductive portion having end portions exposed to both the first and second surfaces of the plate of the elastic body so as to be electrically connected to the land sheet, the land sheet is composed of an insulating sheet having first and second surfaces having first and second electrode portions formed thereon respectively to be electrically conductive to each other, one of said first and second electrode portions being formed on one of the first and second surfaces of the land sheet to be contacted and electrically connected to a terminal of the electrical part and the other of the first and second electrode portions being formed on the other of the first and second surfaces of the land sheet to be contacted and electrically connected to the conductive portion of the contact sheet so as to electrically connect the electrical part to the circuit board.

10. A socket comprising:

an upper plate;

a contact sheet on an upper surface of a circuit board;

a land sheet between the contact sheet and an electrical part mounted on the circuit board; and a lower plate between the circuit board and the contact sheet, wherein the upper plate has a side wall section extending downward for positioning end portions of the contact sheet and end portions of the land sheet so that the end portions of the contact sheet and the end portions of the land sheet are clamped between the upper and lower plates, the contact sheet comprises an elastic body with an insulating property and in form of a plate having first and second surfaces, and a conductive portion embedded in the elastic body, the conductive portion having end portions exposed to both the first and second surfaces of the plate of the elastic body so as to electrically connect to the land sheet, the land sheet comprises of an insulating sheet having first and second surfaces having first and second electrode portions formed thereon, respectively, the first and second electrode portions being electrically conductive to each other, one of the first and second electrode portions being formed on one of the first and second surfaces of the land sheet so that said one of the first and second electrode portions contacts and electrically connects to a terminal of the electrical part, and the other of the first and second electrode portions being formed on the other of the first and second surfaces of the land sheet so that said other of the first and second electrode portions contacts and electrically connects to the conductive portion of the contact sheet, the electrical part thereby being electrically connected to the circuit board.

11. A socket comprising:

an upper plate;

a contact sheet on an upper surface of a circuit board;

a land sheet between the contact sheet and an electrical part mounted on the circuit board; and a lower plate between the circuit board and the contact sheet, wherein end portions of the contact sheet and end portions of the land sheet are clamped between the upper and lower plates, the contact sheet comprises an elastic body with an insulating property and in form of a plate having first and second surfaces, and a conductive portion embedded in the elastic body, the conductive portion having end portions exposed to both the first and second surfaces of the plate of the elastic body so as to electrically connect to the land sheet, the land sheet comprises of an insulating sheet having first and second surfaces having first and second electrode portions formed thereon, respectively, the first and second electrode portions being electrically conductive to each other, one of the first and second electrode portions being formed on one of the first and second surfaces of the land sheet so that said one of the first and second electrode portions contacts and electrically connects to a terminal of the electrical part, and the other of the first and second electrode portions being formed on the other of the first and second surfaces of the land sheet so that said other of the first and second electrode portions contacts and electrically connects to the conductive portion of the contact sheet, the electrical part thereby being electrically connected to the circuit board.

12. A socket comprising:

an upper plate for guiding and accommodating an electrical part;

a contact sheet on an upper surface of a circuit board;

a land sheet between the contact sheet and the electrical part, wherein the contact sheet and the land sheet are clamped between the upper plate and the circuit board, the contact sheet comprises an elastic body with an insulating property and in form of a plate having first and second surfaces, and a conductive portion embedded in the elastic body, the conductive portion having end portions exposed to both the first and second surfaces of the plate of the elastic body so as to electrically connect to the land sheet, the land sheet comprises of an insulating sheet having first and second surfaces having first and second electrode portions formed thereon, respectively, the first and second electrode portions being electrically conductive to each other, one of the first and second electrode portions being formed on one of the first and second surfaces of the land sheet so that said one of the first and second electrode portions contacts and electrically connects to a terminal of the electrical part, and the other of the first and second electrode portions being formed on the other of the first and second surfaces of the land sheet so that said other of the first and second electrode portions contacts and electrically connects to the conductive portion of the contact sheet, the electrical part thereby being electrically connected to the circuit board, wherein the upper plate is provided with a side wall section extending downward for positioning end portions of the contact sheet and end portions of the land sheet.

* * * * *